US008339176B2

(12) United States Patent
Croce

(10) Patent No.: US 8,339,176 B2
(45) Date of Patent: Dec. 25, 2012

(54) SYSTEM AND METHOD FOR PROVIDING A LOW-POWER SELF-ADJUSTING REFERENCE CURRENT FOR FLOATING SUPPLY STAGES

(75) Inventor: Paolo Del Croce, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1244 days.

(21) Appl. No.: 12/130,070

(22) Filed: May 30, 2008

(65) Prior Publication Data

US 2009/0295359 A1 Dec. 3, 2009

(51) Int. Cl.
*H03K 5/00* (2006.01)

(52) U.S. Cl. .............. 327/333; 327/68; 327/72; 327/74; 327/407; 327/408; 327/427; 326/62; 326/63; 326/80; 326/82; 326/83

(58) Field of Classification Search .................... 327/68, 327/72, 74, 333, 408, 427; 326/62, 63, 80, 326/82, 83
See application file for complete search history.

(56) References Cited

U.S. PATENT DOCUMENTS

| | | | | |
|---|---|---|---|---|
| 5,514,948 | A | 5/1996 | Okazaki | |
| 6,236,256 | B1 * | 5/2001 | Brownlow et al. | 327/333 |
| 6,448,811 | B1 | 9/2002 | Narendra et al. | |
| 6,912,150 | B2 * | 6/2005 | Portman et al. | 365/149 |
| 6,980,461 | B2 * | 12/2005 | Portmann et al. | 365/149 |
| 7,671,677 | B2 * | 3/2010 | Kindt et al. | 330/258 |
| 2002/0003446 | A1 * | 1/2002 | Kanda et al. | 327/333 |
| 2003/0038617 | A1 | 2/2003 | Yaklin | |
| 2004/0041593 | A1 * | 3/2004 | Lai | 326/115 |
| 2004/0227166 | A1 * | 11/2004 | Portmann et al. | 257/222 |
| 2005/0162931 | A1 * | 7/2005 | Portmann et al. | 365/189.01 |
| 2009/0027075 | A1 * | 1/2009 | Marsh et al. | 324/763 |

* cited by examiner

*Primary Examiner* — Baq Q Vu
(74) *Attorney, Agent, or Firm* — Slater & Matsil, L.L.P.

(57) ABSTRACT

A system and method for providing an accurate current reference using a low-power current source is disclosed. A preferred embodiment comprises a system comprises a first section and a second section. The first section comprises a first simple current reference, an accurate current reference, and a circuit that generates a digital error signal based upon a comparison of an output of the first simple current reference and an output of the accurate current reference. The second section comprises a second simple current reference providing a second reference current, an adjustment circuit providing an adjustment current based upon the digital error signal, and a circuit biased with current equivalent to a summation of the second reference current and the adjustment current. The first simple current reference and the second simple current reference may be equivalent circuits.

19 Claims, 5 Drawing Sheets

SYSTEM AND METHOD FOR PROVIDING A LOW-POWER SELF-ADJUSTING REFERENCE CURRENT FOR FLOATING SUPPLY STAGES

TECHNICAL FIELD

The present invention relates generally to a system and method for providing a low-power reference current and, more particularly, to a system and method for digitally trimming the current reference based on a more accurate current source.

BACKGROUND

Most integrated circuits (IC) make use of current references. These current references can be realized, for example, by biasing a transistor in a saturation region. The resulting circuit is very simple, requires a small area and can operate with minimum battery voltage. The main limitation to this solution is accuracy of the reference current. The current generated by the transistor cannot be controlled more accurately than the fabrication/temperature spread of the saturation current.

For better accuracy a Band-Gap (BG) based biasing circuit may be used, but this solution also has disadvantages. If it is supplied by a Charge pump, the BG-based solution has a high cost due to the BG current consumption and the resulting impact on the size of the charge pump required to support the BG. It is undesirable to use chip real estate for a large charge pump. An alternative solution is to provide a battery to supply the BG from battery. If a battery is used, then the current consumption of the block is less significant on chip design. Even if a battery is used, a critical issue remains—how to transfer the reference current to the charge pump voltage domain.

SUMMARY OF THE INVENTION

These and other problems are generally solved or circumvented, and technical advantages are generally achieved, by preferred embodiments of the present invention in which a very accurate current source that may require high power levels is used for a short period to generate a digital error signal. The digital error signal may be used to adjust the current from a low-power current source, thereby providing a more accurate current reference.

In accordance with one embodiment of the invention, a system comprises a first section and a second section. The first section comprises a first simple current reference, an accurate current reference, and a circuit that generates a digital error signal based upon a comparison of an output of the first simple current reference and an output of the accurate current reference. The second section comprises a second simple current reference providing a second reference current, an adjustment circuit providing an adjustment current based upon the digital error signal, and a circuit using a signal that is equivalent to a summation of the second reference current and the adjustment current as biasing. The first simple current reference and the second simple current reference may be equivalent circuits. The first simple current reference and the second simple current reference may both comprise an N-channel depletion type MOS transistor. The accurate current reference may be a Band-Gap (BG)-based biasing circuit.

The circuit that generates a digital error signal may further comprise at least one transistor branch, each transistor branch having a node wherein a voltage at the node is selected based upon a difference between the output of the first simple current reference and the output of the accurate current reference. The voltage at the node may correspond to a bit in the digital error signal. In one embodiment, two transistor branches may comprise a first transistor branch having a first transistor and a second transistor branch having a second transistor. The second transistor may have a saturation current that is higher than a saturation current of the first transistor. The ratio of the saturation current of the first transistor to the saturation current of the second transistor is 1:1.5. The circuit that generates a digital error signal may further comprise a digital level shifter, and a latch circuit.

The adjustment circuit may further comprise at least one transistor branch, each transistor branch having a switch controlled by one bit in the digital error signal. When operating in an ON state, the at least one transistor branch may provide at least a portion of the adjustment current. The first and the second section may be disconnected from each other after generation of the digital error signal.

In another embodiment, a system for providing a correction signal for a reference current comprises a first circuit providing a first reference current, and a second circuit providing a second reference current, the second circuit requiring more power than the first circuit. The system further comprising at least two branch circuits. Each branch circuit having a first transistor biased by the first reference current and a second transistor biased by the second reference current. Each branch circuit having a node wherein a voltage at the node is dependent upon a difference between the first reference current and the second reference current. The system comprising an output circuit that provides a digital signal having bits that are proportional to voltages at the nodes of respective ones of the branch circuits.

The first circuit may be an N-channel depletion type MOS transistor, and the second circuit may be a Band-Gap (BG)-based biasing circuit. A first transistor in a first branch circuit may have a higher saturation current than a saturation current in a first transistor in a second branch circuit. The system may have more than two branch circuits, wherein first transistors in each of the branch circuits have a different saturation currents. The output circuit may be a digital level shifter circuit, and a number of bits in the digital signal may correspond to a number of branch circuits. The output circuit may further comprise a latch circuit for storing the digital signal.

In accordance with another embodiment, a system for providing an adjusted reference current comprises a current mirror circuit comprising a first mirror transistor and a second mirror transistor, the second mirror transistor providing current to an output circuit. The system further comprises a reference branch operating in a saturation region and drawing a reference current, and a plurality of adjustment branches, each adjustment branch comprising at least two transistors and providing an adjustment current, the adjustment branches controlled by switching one of the at least two transistors. The current through the first mirror transistor equals the reference current plus adjustment currents for any active adjustment branches.

A latch circuit may be used to store a digital signal, wherein bits in the digital signal are used to switch one of the at least two transistors in the adjustment branches. The current provided to the output circuit by the second mirror transistor is equal to the reference current plus adjustment currents for any active adjustment branches. The adjustment branches may be activated when a corresponding bit in the digital signal has a high value. The output circuit may be an output driver driving an output transistor.

Another embodiment of the invention comprises a method for providing an adjusted reference current. The method comprises generating a first reference current, generating a second reference current, driving first transistors in a plurality of reference branch circuits using the first reference current, driving second transistors in the plurality of reference branch circuits using the second reference current, and detecting voltage levels at nodes between the first transistors and second transistors on each of the reference branch circuits. The voltage levels are stored as digital bits. The method further comprises switching first transistors in a plurality of adjustment branch circuits using the digital bits, wherein each of the adjustment branch circuits is switched On/Off by a different digital bit, drawing a first mirror current through a first mirror transistor, the first mirror current equal to a third reference current plus adjustment currents generated in active ones of the adjustment branch circuits, the third reference current equal to the first reference current, drawing a second mirror current through a second mirror transistor, the second mirror current equal to the first mirror current, and driving an output circuit using the second mirror current.

The first reference current may be generated using an N-channel depletion type MOS transistor, and the second reference current may be generated using a Band-Gap (BG)-based biasing circuit. The digital bits may be stored in a latch circuit. The third reference current may be generated using an N-channel depletion type MOS transistor that is equivalent to the transistor generating the first reference current. Each of the first transistors in the plurality of reference branch circuits may generate a different saturation current.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION

The present invention provides many applicable inventive concepts that can be embodied in a wide variety of specific contexts. The specific embodiments discussed are merely illustrative of specific ways to make and use the invention, and do not limit the scope of the invention.

Figure 1:
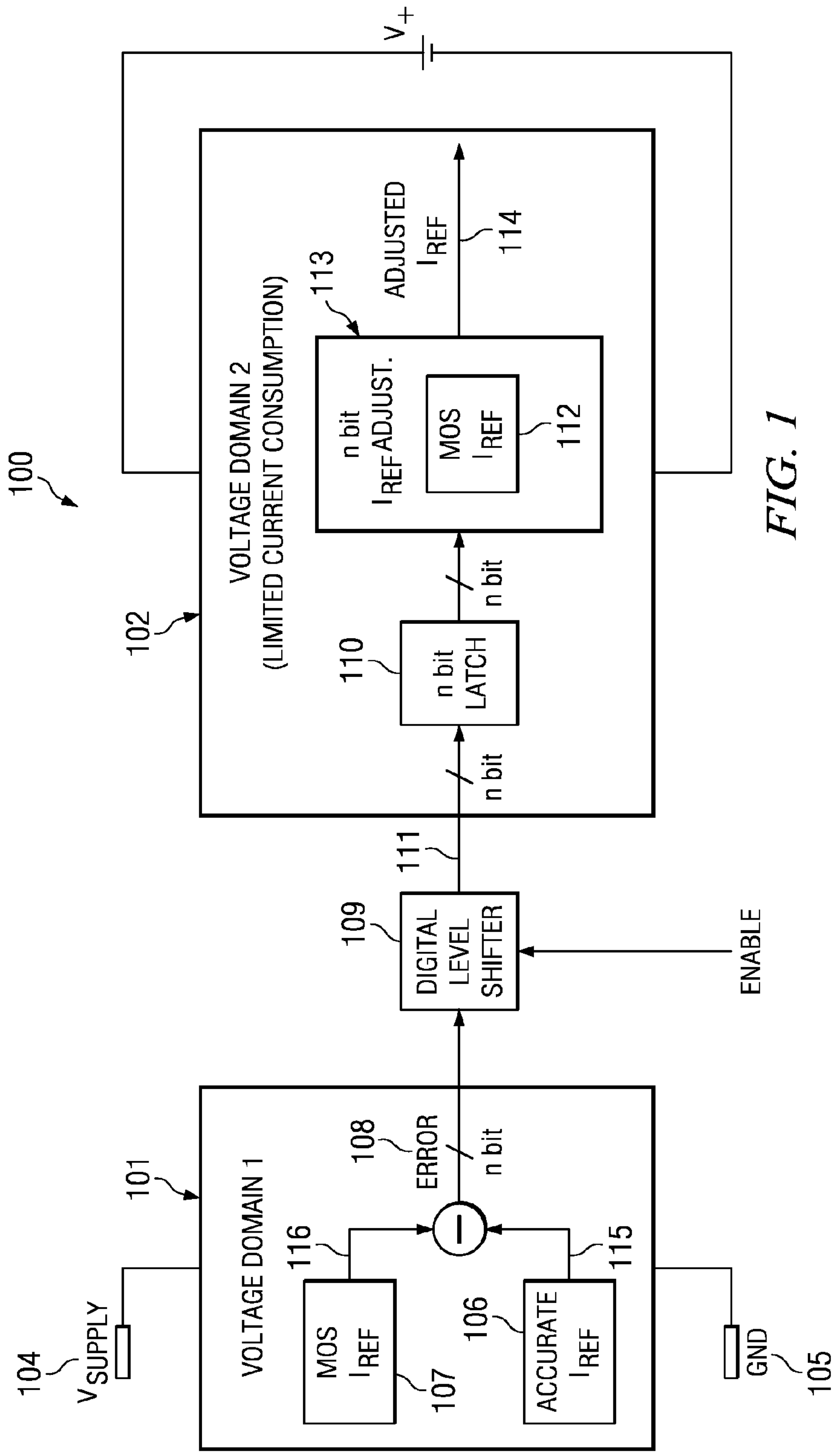
FIG. 1 is a block diagram of one embodiment of a voltage supply system.

FIG. 1 is a block diagram of a system 100, which uses circuitry in two voltage domains 101, 102. Voltage domain circuit 101 generates an accurate current reference that is used in voltage domain circuit 102. Voltage domain circuit 101 uses input voltages $V_{SUPPLY}$ 104 and $V_{GND}$ 105, which are provided by a battery or some other source of power with a high available current. Voltage domain circuit 101 takes advantage of the high available current levels to generate an accurate reference current 115 from accurate current source 106. In one embodiment, accurate current source 106 may be a Band-Gap (BG)-based biasing circuit. The accurate reference current 115 is compared to the current 116 from elementary current source 107. In one embodiment, elementary current source 107 may be an N-channel depletion type MOS transistor. Error signal 108 represents the difference between the accurate reference current 115 and the elementary current source current 116.

Error signal 108 may be a digital signal having any number n bits that are passed through level shifter 109 to voltage domain circuit 102 as error signal 111. Latch 110 in voltage domain 102 holds error signal 111. Voltage domain circuit 102 is a floating supply circuit that is designed to use a very limited current level. Elementary current source 112 is equivalent to or the same as elementary current source 107. n-bit error signal 111 is used by adjustment circuitry 113 to trim the output of elementary current source 112 so that output reference current 114 in voltage domain 102 is ideally the same as accurate reference current 115. In some embodiments, voltage domain 101 may be shut off or disabled once desired accurate reference current 115 is available in voltage domain 102. Voltage domain 102 is then completely independent from voltage domain 101. In other embodiments, trimming can be repeated during operation, for example, to account for changes in elementary current source 112 over time.

Figure 2:
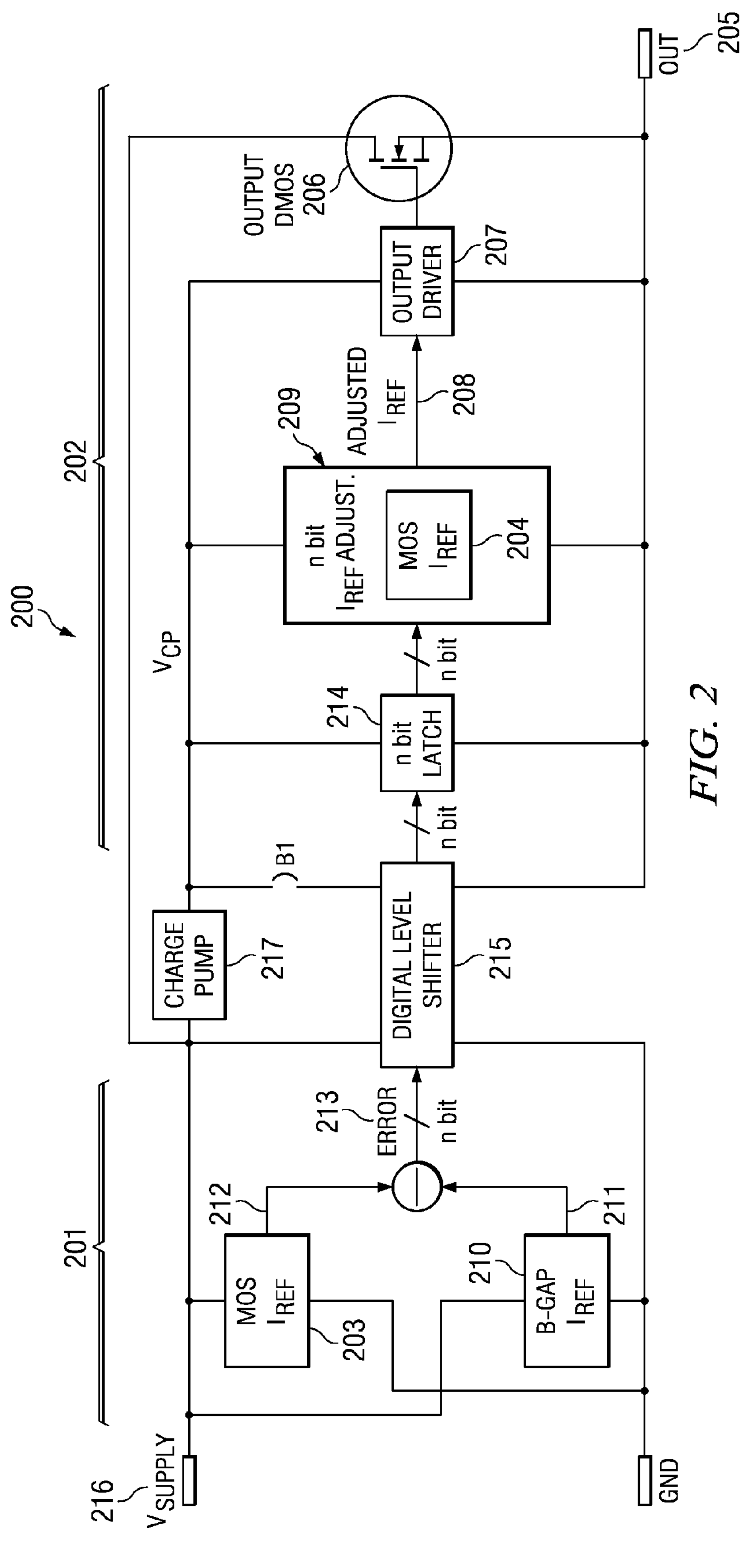
FIG. 2 is a block diagram of another embodiment of a voltage supply system.

FIG. 2 illustrates a high side power switch 200 according to another embodiment of the invention. High side power switch 200 comprises reference current section 201 and operating section 202. Simple current sources 203 and 204 are used by switch 200 to provide a desired output signal 205 using very low current consumption in operating section 202. Output DMOS transistor 206 is biased by output driver 207 to provide output signal 205 at a desired voltage level. Output driver 207 is controlled by adjusted reference current $I_{REF}$ 208, which is generated from adjustment circuitry 209 and simple current source 204.

Reference current section 201 includes an accurate source, which may be on chip, such as Band-Gap-based biasing circuit 210, or an external source. Band-Gap-based biasing circuit 210 provides a very accurate reference current 211, but typically requires a relatively large amount of battery or power supply current to generate accurate reference current 211. Simple current source 203, which has the same structure as simple current source 204, generates reference current 212. Accurate reference current 211 is compared with reference current 212. The difference between accurate reference current 211 and reference current 212 is an error that converted into an n-bit digital error signal 213. Latch 214 stores the digital error signal. Digital level shifter 215 may be used to transfer the error signal from reference current section 201 to operating section 202.

Adjustment circuitry 209 and simple current source 204 use the n-bit error signal to generate adjusted reference current $I_{REF}$ 208, which is the biasing current for output driver 207. As a result, adjusted reference current $I_{REF}$ 208 is ideally equal to accurate reference current 211, without requiring the supply current that is required to drive Band-Gap biasing circuit 210.

Embodiments of the invention use a very simple current reference, such as a MOS transistor in saturation region, for example, that is digitally trimmed after a comparison with a more accurate current source. The difference from the accurate current source is an error signal that converted into a digital value and stored in a latch. The stored digital value is used to correct the biasing current of the output driver.

In one embodiment, if the biasing current correction is done at switching on only (i.e. when $V_{OUT}$ 205<$V_{SUPPLY}$ 216), then circuit 200 may be designed with no impact on the size of charge pump 217. In this situation, no current consumption from charge pump 217 is required, and bridge B1 may be left open because latch 214 and adjustment circuitry 209 do not need DC current. In other embodiments, a correction may be performed at any time by closing bridge B1, thereby using charge pump 217 voltage in level shifter 215.

Once n-bit latch 214 has been set, digital level shifter 215 may be disabled. No further communication between reference current section 201 and operating section 202 is needed. Accordingly, the two voltage domains ($V_{SUPPLY}$-GND and $V_{CP}$-OUT) may be isolated. Output signal 205 may be switched at any time with the adjusted reference current $I_{REF}$ 208, providing all the advantages of a single MOS current reference.

After latch 214 has been set no further communication between the different voltage domains is required. This avoids the problems in known analog solutions that require a DC current to be transferred from a "Supply" to an "Output" voltage domain, thereby suffering from parasitic capacitances at the current mirror. As a consequence, improved performance can be expected in fast switching applications and in terms of Electro-Magnetic Immunity (EMI). No DC current is required from charge pump 217 other than adjusted $I_{REF}$ 208. Level shifter 215 and latch 214 require current from charge pump 217 only during the initial storage of the reference adjustment error signal, or during periodic updates to the stored error signal. Moreover, if the adjustment is done only at switching ON, no current is required at all from charge pump 217.

Figure 3:
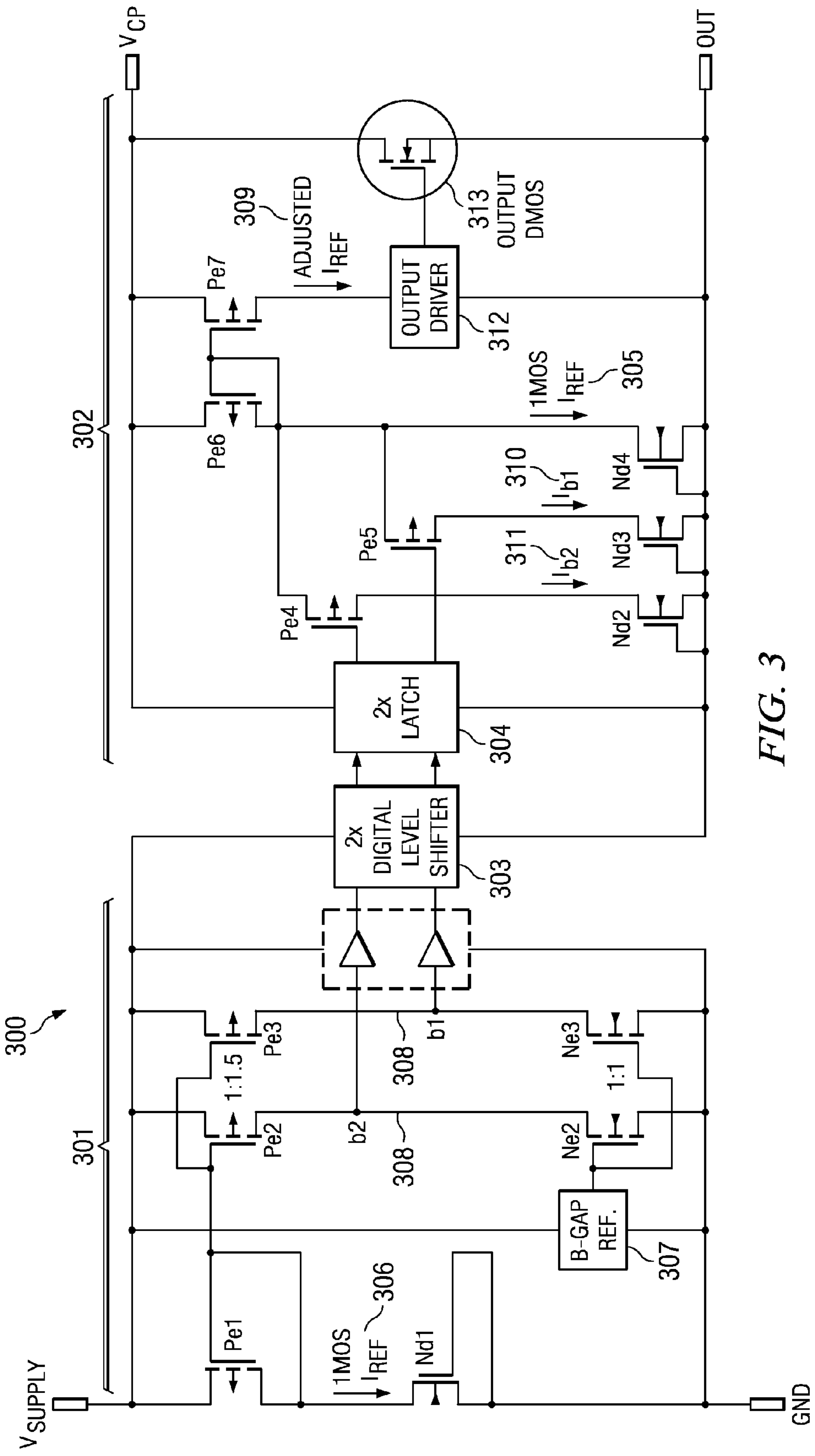
FIG. 3 is a schematic diagram of an embodiment of the invention providing a two-bit error correction signal.

FIG. 3 is a schematic diagram of an embodiment of the invention providing a two-bit error correction signal. High side power switch 300 comprises reference section 301 and operating section 302. A two-bit error signal (b1, b2) is generated in reference section 301, transferred to operating section 302 via 2× digital level shifter 303 and stored in 2× latch 304. Due to PWM application, reference current "adjusted IREF" 309 may be adjusted just during the switching-on phase of the output DMOS. Accordingly, bridge B1 (shown in FIG. 2) has been left open in circuit 300 to avoid any current consumption from the charge pump.

Transistors Nd1, Nd2, Nd3 and Nd4 are depletion N-channel MOS transistors. Transistors Ne2 and Ne3 are enhancement N-channel MOS transistors. Transistors Pe1, Pe2, Pe3, Pe4, Pe5, Pe6 and Pe7 are enhancement P-channel MOS transistors.

The saturation current through transistor Nd4 in branch Nd4-Pe6 defines the current 1MOS $I_{REF}$ 305 in operating section 302. An equivalent branch is repeated in reference section 301 as branch Nd1-Pe1 (where Nd1=Nd4 and Pe1=Pe6). Branch Nd1-Pe1 generates the same current 1MOS $I_{REF}$ 306 as current 1MOS $I_{REF}$ 305 when transistor Nd1 is operating in its saturation region.

Band Gap (B-Gap) reference 307 provides an accurate reference current 308 that is compared to current 1MOS $I_{REF}$ 306 using branches Ne2-Pe2 and Ne3-Pe3. In one embodiment, Ne2 has the same weight as Ne3, while Pe3 is weighted 50% higher than Pe2. For example, the saturation current through Pe2 may be the same as the saturation current through Nd1, and the saturation current through Pe3 may be 1.5 times the saturation current through Nd1. The four transistors (Ne2-Pe2 and Ne3-Pe3) are balanced in such a way that when B-Gap reference current 308 is greater than current 1MOS $I_{REF}$ 306, node b2 is pulled down to GND voltage. When B-Gap reference current 308 is less than current 1MOS $I_{REF}$ 306, node b2 is pulled up to $V_{SUPPLY}$ voltage. Accordingly, the value of node b2 (and node b1) provides information about the relationship between B-Gap reference current 308 and current 1MOS $I_{REF}$ 306. In case 1MOS $I_{REF}$ 306 has exactly the target value, node b2 is pulled down to GND voltage and node b1 is pulled up to $V_{SUPPLY}$ voltage.

The voltages at nodes b1 and b2 are treated as digital signal values, wherein the GND voltage at b2 is treated as a logical 0 (zero) bit and the $V_{SUPPLY}$ voltage at b1 is treated as a logical 1 (one) bit. Level shifter 303 is used to transfer the digital signal values b2, b1 to latch 304.

Transistors Pe4 and Pe5 act as switches that use the b2, b1 bit configuration to adjust the current, Adjusted $I_{REF}$ 309, passing through transistor Pe7. Transistors Pe6 and Pe7 form a current mirror in which the current passing thorough transistor Pe7 mirrors the current passing through transistor Pe6. The current passing through transistor Pe6 is determined by the current 1MOS $I_{REF}$ 305 through transistor Nd4, plus currents $I_{b1}$ 310 and $I_{b2}$ 311 drawn by transistors Nd3 and Nd2, respectively. Accordingly, Adjusted $I_{REF}$=1MOS $I_{REF}+I_{b1}+I_{b2}$. Switches Pe4 Pe5 turn on and off the $I_{b1}$ and $I_{b2}$ currents based upon the bit configuration (b2, b1) in latch 304.

In the example above, wherein latch 304 holds digital values 0,1 (b2, b1), switch Pe4 allows current $I_{b2}$ to flow, but switch Pe3 is open and prevents $I_{b1}$ from flowing, so that Adjusted $I_{REF}$=1MOS $I_{REF}+I_{b2}$. This represents the current to output driver 312 in ideal conditions. Output driver 312 then drives output DMOS 313.

It is assumed that transistors Nd1 and Nd4 are nearly identical so that changes in temperature or construction will affect both transistors equally. If the saturation current (1MOS $I_{REF}$) for Nd1 and Nd4 increases (relative to B-Gap reference current 308) due to temperature changes or process spread, for example, node b2 will be also pulled up in branch Pe2-Ne2. Accordingly, digital values 1,1 will be stored to latch 304. Switch Pe4, which uses the value from node b2, will then be switched off, thereby eliminating current $I_{b2}$ in branch Pe4-Nd2 and reducing Adjusted $I_{REF}$ 309 to just 1MOS $I_{REF}$.

If the saturation current (1MOS $I_{REF}$) for Nd1 and Nd4 decreases (relative to B-Gap reference current 308) due to temperature changes or process spread, for example, both the nodes b1 and b2 will be pulled down so that digital values 0,0 will be stored to latch 304. Switches Pe4 and Pe5 will both switch on, allowing current to flow in branches Pe4-Nd2 and Pe5-Nd3, which sill increase Adjusted $I_{REF}$ to 1MOS $I_{REF}+I_{b1}+I_{b2}$.

With an ideal Band-Gap reference, the bits b1, b2 commutate if the process/temperature spread changes the saturation current (1MOS $I_{REF}$) by more than 25%. The process/temperature spread of Adjusted $I_{REF}$ can be corrected by designing Nd2, Nd3 with the proper weight.

After the two bit latch 304 has been set, digital level shifter 303 may be disabled. No further communication between the two voltage domains (i.e. reference section 301 and operating section 302) is needed. OUT can be switched with the Adjusted $I_{REF}$ current and output driver 312 may work independently of the other voltage domains.

Figure 4:
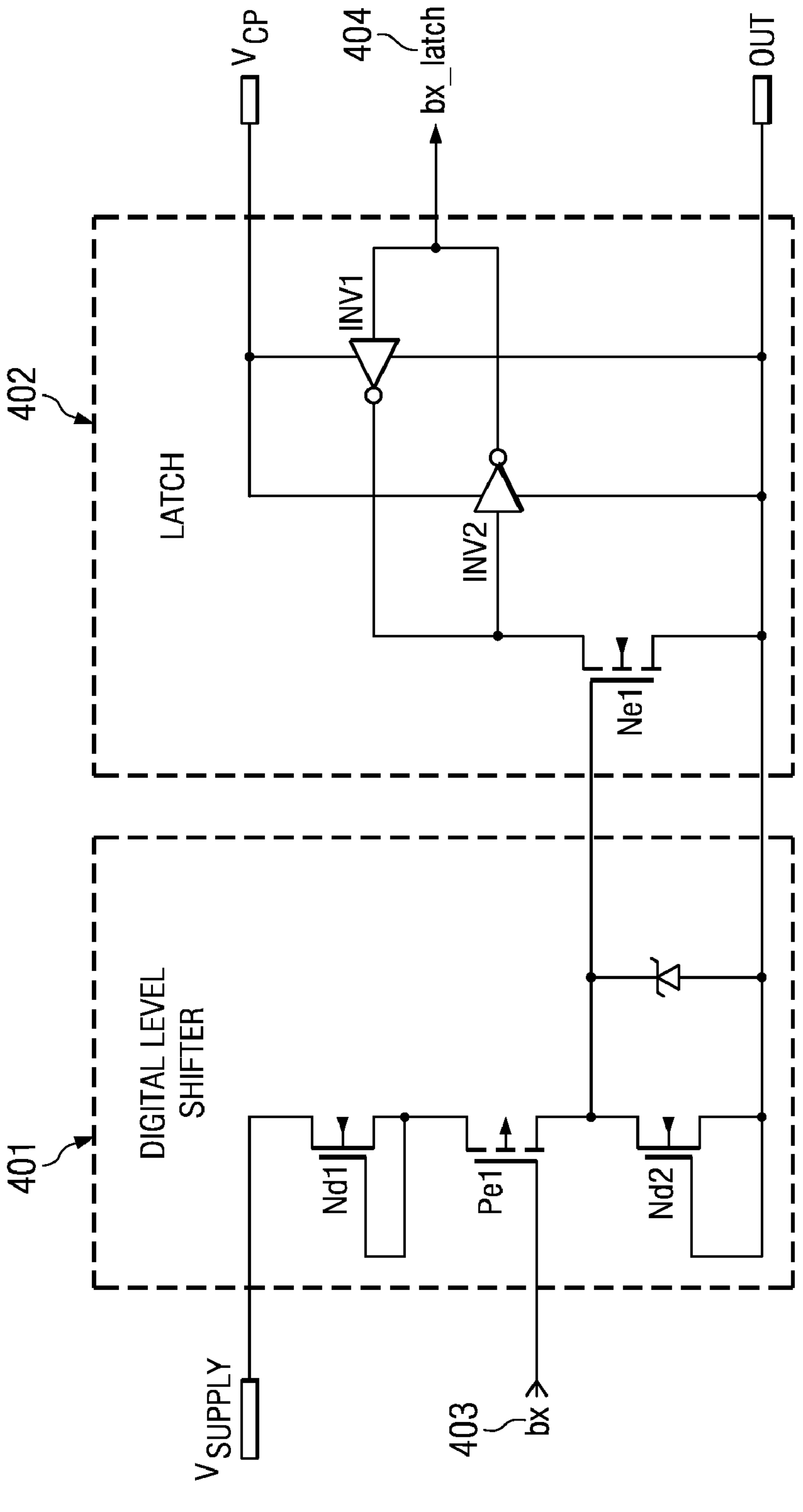
FIG. 4 illustrates an exemplary embodiment of a digital level shifter and latch.

FIG. 4 illustrates one embodiment of a digital level shifter 401 and latch 402 that may be used, for example, with the circuit illustrated in FIG. 3. Input voltage value bx 403 is received from a branch in a reference section and stored to latch 402. Output bx_latch 404 is then provided to a branch in an operating section to switch on or off current corrections. Latch 402 comprises INV 1 and INV2 and, in one embodiment, may be reset to bx_latch (404)=low before adjusted the $I_{REF}$ current. After resetting, the $I_{REF}$ current can be adjusted using the bit status bx 403. Level shifter 401 may be disabled by biasing bx 403 with voltage $V_{SUPPLY}$. As a result, the operating stage and latch 402 remain separated from $V_{SUPPLY}$. Level shifter 401 and latch 402 circuitry may be repeated for each node bx (e.g. nodes b2, b1 in FIG. 3) so that each digital value may be held separately.

With respect to circuit 300 in FIG. 3, it will be understood that the invention is not limited to two bits of current adjustment information. Other transistor branches Pex-Nex may be added to reference section 301 and other branches Pex-Ndx may be added to operating section 302. The additional reference section branches (Pex-Nex) may be designed using ratios for transistor Pex other than 1:1.5 to provide additional accuracy or levels of granularity for the current correction. Each additional reference section branches (Pex-Nex) would have a node bx that provides an additional data bit to level shifter 303 and latch 304. Transistor Pex in additional branch Pex-Ndx for operating section 302 would switch on/off based upon the value in additional bit bx. This would allow additional current Ibx to be added to the Adjusted $I_{REF}$ current. For example, the Adjusted $I_{REF}$ could equal 1MOS $I_{REF}+I_{b1}+I_{b2}+I_{bx}$. Any number of additional branches may be added to circuit 300.

Moreover, it will be understood to one of ordinary skill in the art that latch circuits used in embodiments of the inventions, such as exemplary latches 110, 214, and 304, may be embodied as any form of memory element or circuit, such as latch 402 of FIG. 4, Flip-Flops, static RAM cells, or the like. One of ordinary skill will also understand that there are numerous methods and systems for producing an accurate reference current for use in embodiments of the invention, including for example, a Band-Gap (BG)-based biasing circuit or other current source that is internal to the chip or an external current source. It will be also understood that the present invention is not limited to the current-comparison circuits illustrated in the exemplary embodiments, but may be used with any other configuration or circuits that provide a comparison between two or more currents.

Figure 5:
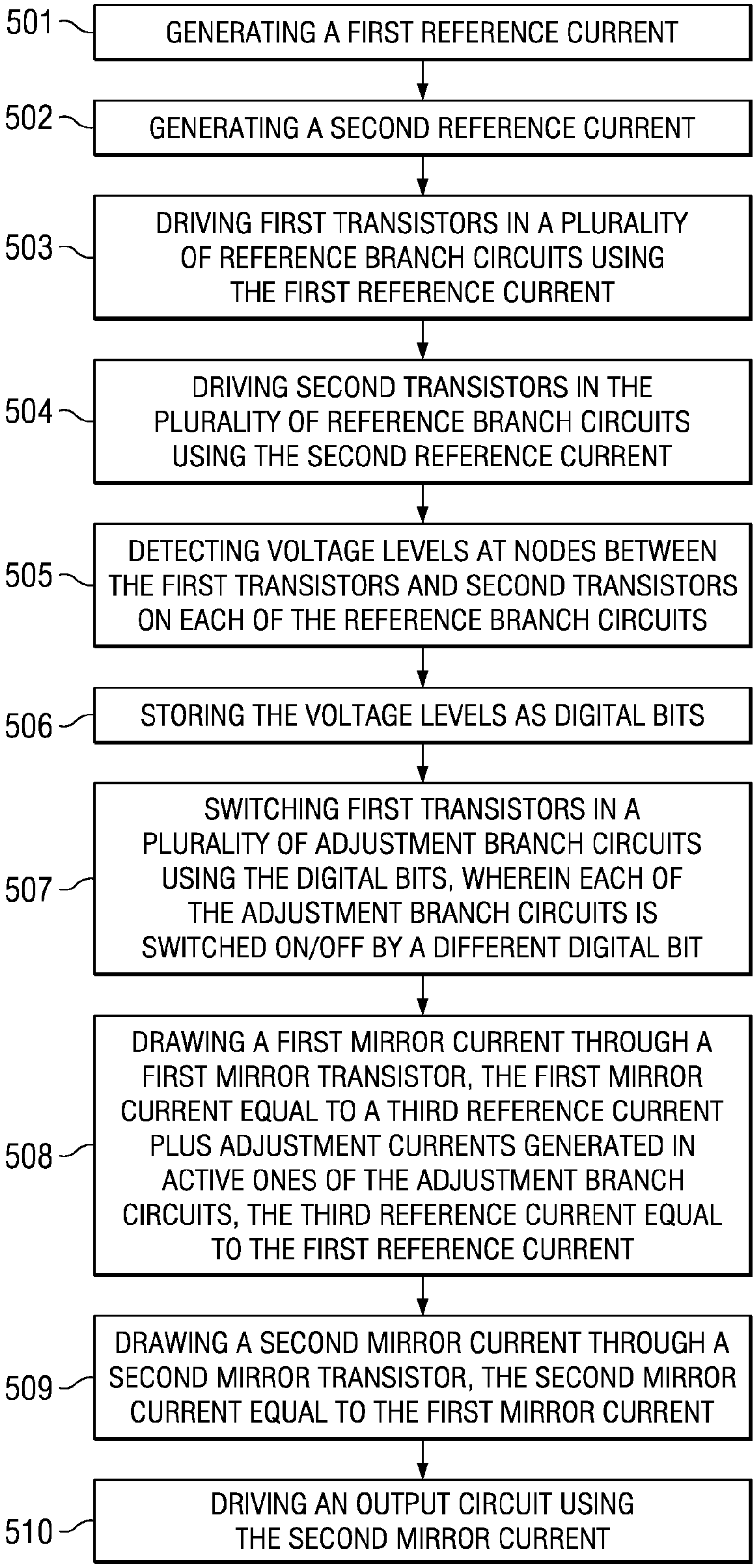

FIG. 5 illustrates a flowchart for an exemplary embodiment of a method for providing an adjusted reference current. The method illustrated in FIG. 5 may be implemented, for example, using systems 100, 200, 300 (FIGS. 1-3), but is not intended to be limited to such configurations. Moreover, it will be understood that the steps of the method illustrated in FIG. 5 may be performed in the order indicated, or in any other order, or simultaneously, or in conjunction with other steps or methods. In step 501, a first reference current is generated, and a second reference current is generated in step 502. In step 503, first transistors in a plurality of reference branch circuits are driven using the first reference current, and second transistors in the plurality of reference branch circuits are driven using the second reference current in step 504.

In step 505, voltage levels are detected at nodes between the first transistors and second transistors on each of the reference branch circuits, and the voltage levels are stored as digital bits in step 506. In step 507, first transistors in a plurality of adjustment branch circuits are switched using the digital bits. Each of the adjustment branch circuits is switched On/Off by a different digital bit. In step 508, a first mirror current is drawn through a first mirror transistor. The first mirror current is equal to a third reference current plus adjustment currents generated in active ones of the adjustment branch circuits. The third reference current equal to the first reference current. In step 509, a second mirror current is drawn through a second mirror transistor. The second mirror current equal to the first mirror current. In step 510, an output circuit is driven using the second mirror current.

The first reference current may be generated using an N-channel depletion type MOS transistor, and the second reference current may be generated using a Band-Gap (BG)-based biasing circuit. The digital bits may be stored in a latch circuit. The third reference current may be generated using an N-channel depletion type MOS transistor that is equivalent to the transistor generating the first reference current. Each of the first transistors in the plurality of reference branch circuits may generate a different saturation current.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system comprising:
- a first section, comprising:
  - a first simple current reference;
  - an accurate current reference; and
  - a circuit that generates a digital error signal based upon a comparison of an output of the first simple current reference and an output of the accurate current reference; and
- a second section, comprising:
  - a second simple current reference providing a second reference current;
  - an adjustment circuit providing an adjustment current based upon the digital error signal; and
  - a circuit having a biasing equivalent to a summation of the second reference current and the adjustment current.

2. The system of claim 1, wherein the first simple current reference and the second simple current reference are equivalent circuits.

3. The system of claim 1, wherein the accurate current reference can be generated on chip or externally.

4. The system of claim 1, wherein the circuit that generates a digital error signal further comprises:
- at least one transistor branch, each transistor branch having a node wherein a voltage at the node is selected based upon a difference between the output of the first simple current reference and the output of the accurate current reference.

5. The system of claim 4, wherein the voltage at the node corresponds to a bit in the digital error signal.

6. The system of claim 1, wherein the circuit that generates a digital error signal further comprises:
- a digital level shifter; and
- a memory element.

7. The system of claim 1, wherein the adjustment circuit further comprises:
- at least one transistor branch, each transistor branch having a switch controlled by one bit in the digital error signal.

8. The system of claim 7, wherein, in an ON state, the at least one transistor branch provides at least a portion of the adjustment current.

9. A system for providing a correction signal for a reference current, comprising:

a first circuit providing a first reference current;

a second circuit providing a second reference current, the second circuit requiring more power than the first circuit;

at least one branch circuit, each branch circuit comprising a node wherein a voltage at the node is dependent upon a difference between the first reference current and the second reference current; and an output circuit that provides a digital signal comprising bits that are proportional to voltages at the nodes of respective ones of the branch circuits.

10. The system of claim 9, wherein the output circuit is a digital level shifter circuit, and wherein a number of bits in the digital signal corresponds to a number of branch circuits.

11. The system of claim 9, wherein the output circuit further comprises a memory element for storing the digital signal.

12. A system for providing an adjusted reference current, comprising:

a current mirror circuit comprising a first mirror transistor and a second mirror transistor, the second mirror transistor providing current to an output circuit;

a reference branch drawing a reference current;

a plurality of adjustment branches, each adjustment branch providing an adjustment current, the adjustment branches controlled by switching one of the transistors;

wherein the current through the first mirror transistor equals the reference current plus adjustment currents for any active adjustment branches.

13. The system of claim 12, further comprising:

a memory element circuit storing a digital signal, wherein bits in the digital signal are used to switch transistors in the adjustment branches.

14. The system of claim 13, wherein the current provided to the output circuit by the second mirror transistor is equal to the reference current plus adjustment currents for any active adjustment branches.

15. The system of claim 14, wherein the adjustment branches are activated when a corresponding bit in the digital signal has been set.

16. The system of claim 12, wherein the output circuit is any stage which needs a biasing current.

17. A method for providing an adjusted reference current, comprising:

generating a first reference current;

generating a second reference current;

driving first transistors in a plurality of reference branch circuits using the first reference current;

driving second transistors in the plurality of reference branch circuits using the second reference current;

detecting voltage levels at nodes between the first transistors and second transistors on each of the reference branch circuits;

storing the voltage levels as digital bits;

switching first transistors in a plurality of adjustment branch circuits using the digital bits, wherein each of the adjustment branch circuits is switched On/Off by a different digital bit;

drawing a first mirror current through a first mirror transistor, the first mirror current equal to a third reference current plus adjustment currents generated in active ones of the adjustment branch circuits, the third reference current equal to the first reference current;

drawing a second mirror current through a second mirror transistor, the second mirror current equal to the first mirror current; and driving an output circuit using the second mirror current.

18. The method of claim 17, wherein the digital bits are stored in a memory element circuit.

19. The method of claim 17, wherein the third reference current is equivalent to the first reference current.

* * * * *